United States Patent [19]

Tokunaga

[11] Patent Number: 5,296,087
[45] Date of Patent: Mar. 22, 1994

[54] CRYSTAL FORMATION METHOD

[75] Inventor: Hiroyuki Tokunaga, Kawasaki, Japan

[73] Assignee: Canon Kabushiki Kaisha, Tokyo, Japan

[21] Appl. No.: 988,006

[22] Filed: Dec. 9, 1992

Related U.S. Application Data

[63] Continuation of Ser. No. 690,324, Apr. 26, 1991, abandoned, which is a continuation of Ser. No. 234,751, Aug. 22, 1988, abandoned.

[30] Foreign Application Priority Data

Aug. 24, 1987 [JP] Japan .................... 62-209462

[51] Int. Cl.$^5$ .............................. C30B 25/12
[52] U.S. Cl. ................... 156/611; 156/612; 156/614; 156/DIG. 70; 156/DIG. 88; 437/83; 437/84; 437/89
[58] Field of Search .............. 156/610, 611, 612, 614, 156/DIG. 69, DIG. 70, DIG. 88, DIG. 89; 437/83, 84, 89, 90, 93; 427/255.1, 255.6, 255.7

[56] References Cited

U.S. PATENT DOCUMENTS

| | | | |
|---|---|---|---|
| 3,620,833 | 11/1971 | Gleim et al. | 117/212 |
| 4,058,430 | 11/1977 | Suntola et al. | 156/611 |
| 4,413,022 | 11/1983 | Suntola et al. | 427/255.7 |
| 4,463,492 | 8/1984 | Maeguchi et al. | 437/84 |
| 4,806,321 | 2/1989 | Nishizawa et al. | 156/611 |

FOREIGN PATENT DOCUMENTS 3634140 10/1986 Fed. Rep. of Germany .

OTHER PUBLICATIONS

Jastrzebski et al. "Growth Process of Silicon over SiO$_2$ by CVD: ELO technique" J. Electrochem Soc. Jul. 1983 pp. 1571-1580.
Claassen et al. "The Nucleation of CVD Silicon on SiO$_2$ and Si$_3$N$_4$ Substrates" J. Electrochem Soc. Jan. 1980 pp. 194-202.
Nishizawa et al. "Crystal Growth by Atomic Layer Epitaxy" Tohoku University Jan. 23, 1984.

Primary Examiner—Robert Kunemund
Attorney, Agent, or Firm—Fitzpatrick, Cella, Harper & Scinto

[57] ABSTRACT

A crystal formation method is disclosed which is a crystal growth method comprising feeding two or more kinds of reactive starting gases alternately into a crystal formation treatment space having a substrate with a non-nucleation surface ($S_{NDS}$) having small nucleation density and a nucleation surface ($S_{NDL}$) having sufficiently small area for crystal growth only from a single nucleus, and larger nucleation density ($ND_L$) than the nucleation density ($ND_S$) of said non-nucleation surface ($S_{NDS}$) being arranged adjacent to each other arranged therein, thereby permitting a monocrystal to grow selectively from said single nucleus, characterized in that when one of the starting gases is changed over to the other starting gas, the reaction vessel is once evacuated internally to $10^{-2}$ Torr or less.

2 Claims, 5 Drawing Sheets

CRYSTAL FORMATION METHOD

This application is a continuation, of application Ser. No. 07/690,324 filed Apr. 26, 1991, now abandoned, which is a continuation of application Ser. No. 07/234,751 filed Aug. 22, 1988, now abandoned.

BACKGROUND OF THE INVENTION

1. Field of the Invention

This invention relates to a method for forming a crystal to be used for electronic materials, etc. according to the gas phase method.

2. Related Background Art

In the crystal formation methods in recent years, the Atomic Layer Epitaxy method having the characteristics of good controllability of crystal growth capable of effecting film growth one atomic layer and also suppressing the growth temperature at a lower level has been proposed (Usui, Sunakawa, Jap. J. Appl. Phys. 25 (1986), 212).

This is a technique in which a thin film is grown by feeding alternately reactive starting gases without mixing and allowing them to react on the surface of a substrate.

However, the above Atomic Layer Epitaxy method must use a monocrystal substrate, and therefore the cost is high, and there is also involved the problem that enlargement of area can be done with difficulty.

On the other hand, the experimental results about selectivity for crystal formation on any desired substrate are described in Classen, J. Electrochem. Soc. Vol. 127, No. 1, January 1980, 194-202.

The contents described in the above literature include preparation of two kinds of substrate having the surface comprising a material ($Si_3N_4$) on which formation of a film to be deposited can be easily done and the surface comprising a material ($SiO_2$) on which formation of a film to be deposited can be difficultly done and confirmation on the trial basis of selectivity of formation of silicon crystal on those substrates.

The above literature suggests that a crystalline deposited film can be formed selectively on a desired substrate by utilizing selectivity for crystal formation as described in the above literature. However, even so, there is nothing suggested about the method for forming a monocrystal deposited film at a desired position on the surface of a desired substrate.

Also, from the contents of description in the above literature, nothing is suggested about formation of a polycrystal by controlling the grain sizes of crystals with good precision.

Accordingly, it has been earnestly desired to have a technique for forming a monocrystal with good controllability at a desired position on a substrate by using any desired substrate which can suppress the cost at a lower level.

As the technique earnestly desired as mentioned above, European Published Patent Application No. 0,244,081 filed by the assignee of the present application discloses formation at any desired position on the substrate by utilizing the selective nucleation method at a cost suppressed at a lower level and formation of a polycrystal by controlling the crystal grain sizes of monocrystals with good precision.

To show the crystal formation method utilizing the selective nucleation method disclosed in the above European Published Patent Application No. 02440821 as an example for better understanding of the present invention, the selective nucleation method, to show it conceptionally by way of example, is a method in which on a substrate having a non-nucleation surface ($S_{NDS}$) having small nucleation density and a nucleation surface ($S_{NDL}$) arranged adjacent to the non-nucleation surface ($S_{NDS}$), having sufficiently small surface area for permitting crystal growth only from a single nucleus and larger nucleation density ($ND_L$) than the nucleation density ($ND_S$) of the non-nucleation surface ($S_{NDS}$), crystal growth is effected originating from the single nucleus formed on the above nucleation surface ($S_{NDL}$), and further the monocrystal is grown beyond the nucleation surface ($S_{NDL}$) even to cover over the non-nucleation surface ($S_{NDS}$).

The above method for forming a crystal has various excellent industrial advantages, but for utilization for various uses, it is desirable to further improve completeness of monocrystal quality, yield, productivity, bulk productivity, etc.

The present inventor, in view of the above points, aims at improving further the above method for forming a crystal so that it can be optimized for preparation of a crystal utilizable for formation of various electronic devices, optical devices, etc. of high performance and high characteristics.

As the results of further studies made by the present inventor according to the selective nucleation method, the present inventor has found that in the selective nucleation method, when the crystal growth treatment is performed by the gas phase method by use of reactive starting gases, the starting gases will react with each other in the gas phase, whereby two points antagonistic to each other exist, and that the measure for solving the problems obtained from these knowledges can give better embodiments of the present invention. These solving measures can apply the selective nucleation method for broader scope of uses.

SUMMARY OF THE INVENTION

An object of the present invention is to provide a crystal formation method which can improve the above points to be improved and can be applied for broader scope of uses.

Another object of the present invention is to provide a method for forming a crystal by which a more complete monocrystallinity can be obtained.

Still another object of the present invention is to provide a method for forming a crystal having excellent productivity and bulk productivity.

Yet another object of the present invention is to provide a method for forming a crystal which can prepare a crystal of good quality to be utilized for formation of electronic devices, optical devices, etc. having high function and high device characteristics.

Again, another object of the present invention is to provide a crystal formation method which is a selective nucleation method for growing a monocrystal by applying a crystal formation treatment according to the gas phase method to a substrate existing in a crystal formation treatment space on which a non-nucleation surface ($S_{NDS}$) having small nucleation density and a nucleation surface ($S_{NDL}$) having sufficiently small surface area for crystal growth only from a single nucleus, and larger nucleation density ($ND_L$) than the nucleation density ($ND_S$) of the non-nucleation surface ($S_{NDS}$) are arranged adjacent to each other, the method comprising feeding a plural number of reactive starting gases alternately into the crystal growth treatment space.

Again, another object of the present invention is to provide a crystal growth method in which the addition reaction in the gas phase which will lower crystallinity is inhibited.

Yet still another object of the present invention is to provide a crystal growth method, which comprises forming a crystal by feeding first only one starting gas (A) among a plural number of reactive gases onto the surface of a substrate having a nucleation surface ($S_{NDL}$) and a non-nucleation surface ($S_{NDS}$) arranged thereon to thereby inhibit the reaction and increase the mobility of the starting gas on the substrate surface, thus capturing the gas molecules migrated on the substrate surface at the nucleation surface to form a thin absorption layer of several layers of molecules or less, subsequently stopping feeding of the starting gas (A) and feeding the other reactive gas (B) onto the substrate surface in the crystal formation treatment space, thereby effecting the chemical reaction thereof with the above absorption layer.

Yet again another object of the present invention is to provide a crystal growth method, in which the growth speed will not be influenced by the form, density and arrangement of the nucleation surface because the reaction is proceeded mutually between the absorbed atoms with a thickness of several atom layers or less, by feeding alternately a plural number of reactive starting gases.

DESCRIPTION OF THE PREFERRED EMBODIMENTS

Figure 1A:
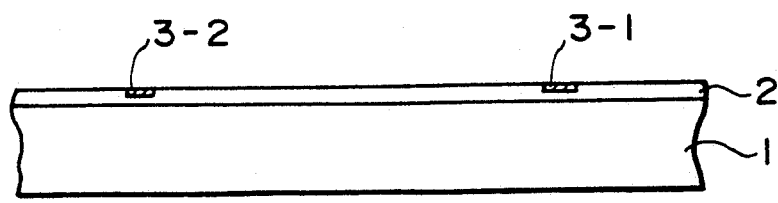
FIGS. 1a and 1d are diagrams of the steps of the crystal growth method according to the selective nucleation method.
Figure 1B:
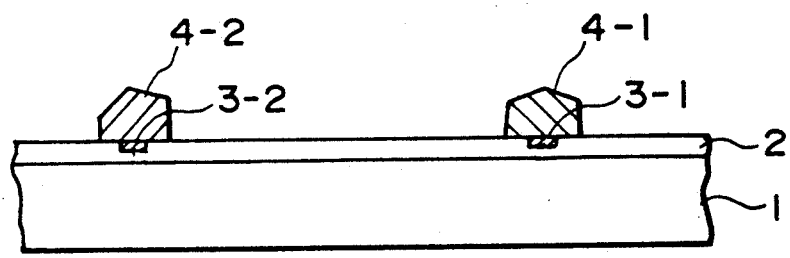
Figure 1C:
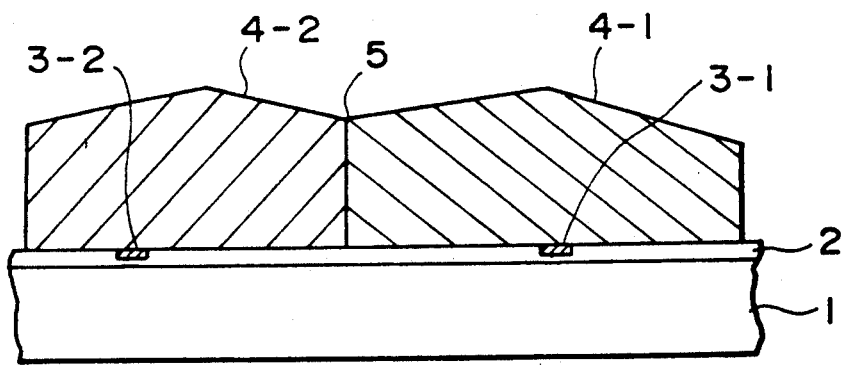
Figure 1D:
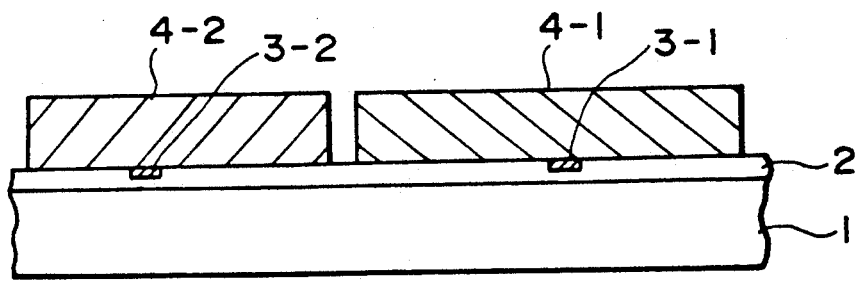

FIG. 1 is a diagram of the steps for illustration of an example of the crystal formation method of the present invention according to the selective nucleation.

The substrate on which crystal formation is to be applied is prepared as described below.

First, a support 1 which can stand high temperature comprising a high melting glass, quartz, alumina, ceramics, etc. is prepared.

On the above support 1 are arranged a non-nucleation surface ($S_{NDS}$) comprising a material with small nucleation density and a nucleation surface ($S_{NDL}$) having greater nucleation density than the non-nucleation surface ($S_{NDS}$) and having a sufficiently fine surface area for giving arise to crystal growth with a single nucleus as the originating point to form a monocrystal.

As the material for forming the non-nucleation surface ($S_{NDS}$), for example, if a silicon crystal is to be formed, silicon oxide is preferred. However, silicon oxide is not limitative of the present invention, but a material can be used which will cause substantially no nucleation in relationship with the material, the size and the arrangement of the nucleation surface ($S_{NDL}$) and the growth conditions. Of course, the material of the support 1 may be made the material for formation of the non-nucleation surface ($S_{NDS}$), and in this case no film comprising the material for non-nucleation surface ($S_{NDS}$) may be formed on the support 1.

For depositing, for example, a $SiO_2$ film as the material for forming the non-nucleation surface ($S_{NDS}$), a $SiO_2$ film 2 may be deposited according to conventional CVD (Chemical Vapor Deposition) method by use of silane ($SiH_4$) and oxygen ($O_2$).

The size of the nucleation surface ($S_{NDL}$), for permitting a crystal to grow from a single nucleus, has preferably a sufficiently small area, having a diameter generally of several $\mu m$ or less and an area of 16 $\mu m^2$ or less, more preferably a diameter of 2 $\mu m$ or less and an area of 4 $\mu m^2$ or less, optimally a diameter of 1 $\mu m$ or less and an area of 1 $\mu m^2$ or less.

The material for giving the nucleation surface ($S_{NDL}$) should preferably be amorphous.

As the method for forming the nucleation surface ($S_{NDL}$), there are the method in which it is formed by ion implantation on the non-nucleation surface ($S_{NDS}$), the method in which a thin film of a material which will become a nucleation surface ($S_{NDL}$) with large nucleation density is formed and then subjected to patterning according to the photolithographic technique, etc. However, the method for forming the nucleation surface ($S_{NDL}$) is not limited to these methods.

Next, an example of a method for forming the nucleation surface ($S_{NDL}$) is to be described.

First, the film 2 comprising, for example, $SiO_2$ which gives the non-nucleation surface ($S_{NDS}$) is masked to a desired pattern with a photoresist. By use of an ion implanter, for example, $As^{3-}$ ions are implanted into a desired position of the film 2. Namely, $As^{3-}$ ions are implanted only into the film 2 through the exposed surface of the film 2 from the mask (FIG. 1(A)). At the surface where no ion is implanted, the nucleation density ($ND_S$) of the crystal remains small, and this portion gives the non-nucleation surface ($S_{NDS}$). On the other hand, in the regions 3-1, 3-2 where ions are implanted, they have larger nucleation density ($ND_L$) than the non-nucleation density ($S_{NDS}$), and these portions give the nucleation surface ($S_{NDL}$).

As the element for the ions to be implanted into the non-nucleation surface ($S_{NDS}$), when a II–VI group compound crystal is to be grown, there may be included the elements belonging to the group II and the elements belonging to the group VI of the Periodic Table, for example, S, Se, Te, Zn, Cd, etc. On the other hand, when a III–V group compound crystal is to be grown, there may be included the elements belonging to the group III and the elements belonging to the group V of Periodic Table, for example, N, P, As, Sb, Al, Ga, In, etc.

For the nucleation surface ($S_{NDL}$) to have sufficiently larger nucleation density than the non-nucleation surface ($S_{NDS}$), the amount of ions implanted may be preferably $1\times10^{15}/cm^3$ or more, more preferably $1\times10^{16}/cm^3$ or more.

After formation of the nucleation surface ($S_{NDL}$), the surface is cleaned and the crystal formation treatment is applied on the substrate.

First, the substrate is heated to a predetermined temperature. As the substrate temperature, 200° to 950° C. may be preferred, but this range is not limitative of the present invention, but an appropriate temperature range may be selected depending on the kind of the crystal to be grown.

Subsequently, after the reaction vessel (crystal growth treatment space) is evacuated internally, a plural number of starting gases are introduced into the reaction vessel, and the starting gases are fed onto the substrate surface alternately so that no general mixing may occur. At this time, in introducing another starting gas (B) in place of the starting as (A) already introduced, it is preferable to evacuate once the reaction vessel internally to $10^{-2}$ Torr or less before introduction of the starting gas (B), but the method for avoiding mixing of the starting gases is not limited to this method. For example, the concentrations of the starting gases may be alternately changed.

The pressure range in the reaction vessel during the crystal formation treatment may be preferably $10^{-1}$ to 10 Torr when introducing the starting gases, preferably $10^{-8}$ to $10^{-2}$ Torr when switching over introduction of the starting gases.

The time for introducing the starting gases into the reaction vessel during the crystal formation treatment may be preferably 5 sec. to 1 min., and the time for evacuating the starting gases preferably 20 sec. to 3 min. It is also preferable that the time for introducing the gases be shorter than the time for evacuating the gases.

The operations as described above are repeated until completion of the crystal formation treatment, thereby permitting crystals to grow.

As the starting gas to be used in the present invention, when the crystal of the group II-VI compound is to be grown, there may be included organometallic compounds containing the group II element and organometallic compounds containing the group VI element or hydrides of the group VI element. Specific examples may include dimethylzinc $Zn(CH_3)_2$, diethylzinc $Zn(C_2H_5)_2$, dimethylcadmium $Cd(CH_3)_2$, diethylcadmium $Cd(C_2H_5)_2$, selenium hydride $H_2Se$, dimethylselenium $Se(CH_3)_2$, diethylselenium $Se(C_2H_5)_2$, dimethyltellurium $Te(CH_3)_2$, diethyltellurium $Te(C_2H_5)_2$, hydrogen sulfide $H_2S$, etc.

When the crystal of the group III-V compound is to be grown, organometallic compounds containing the group III element and organometallic compounds containing the group V element or hydrides of the group V element may included as the starting gas. Specific examples may include trimethylaluminum $Al(CH_3)_3$, triethylaluminum $Al(C_2H_5)_3$, triisobutylaluminum $Al(i-C_4H_9)_3$, trimethylgallium $Ga(CH_3)_3$, triethylgallium $Ga(C_2H_5)_3$, trimethylindium $In(CH_3)_3$, triethylindium $In(C_2H_5)_3$, tripropylindium $In(C_3H_7)_3$, tributylindium $In(C_4H_9)_3$, phosphine $PH_3$, t-butylphosphine $t-C_4H_9PH_2$, arsine $AsH_3$, trimethylarsine $As(CH_3)_3$, triethylarsine $As(C_2H_5)_3$, diethylarsine $(C_2H_5)_2AsH$, t-butylarsine $t-C_4H_9AsH_2$, trimethylantimony $Sb(CH_3)_3$, tripropylantimony $Sb(C_3H_7)_3$, tributylantimony $Sb(C_4H_9)_3$, etc.

Also, in introduction of the starting gases into the reaction vessel, they may be diluted with a carrier gas such as $H_2$, He, Ar, etc., if desired.

In the following, specific points of more preferred embodiments of the present invention are to be described. In the description, the two technical points antagonistic to each other as mentioned above are first explained.

The first point is generation of a plural number of nuclei on the nucleation surface subjected to fine patterning, whereby crystal growth occurs with each of the plural number of nuclei as the originating point of crystal growth, and therefore the crystal grown may become a polycrystal, or in some cases, nucleus is also generated on the non-nucleation surface to cause abnormal nucleus generation phenomenon which disturbs arrangement of the crystal islands which are independent monocrystal regions.

The second point is occurrence of the defect phenomenon, in which no crystal island grows on the nucleation surface in some of the nucleation surfaces provided in a large number.

These two phenomena are generated in relationship antagonistic to each other under the preparation parameters for selective nucleation particularly in the steps of applying the crystal formation treatment by the gas phase method. For explanation of this, the relationship between the two of abnormal nucleus generation probability and crystal defect generation probability in selective nucleation of Si crystal is shown below.

Figure 2:
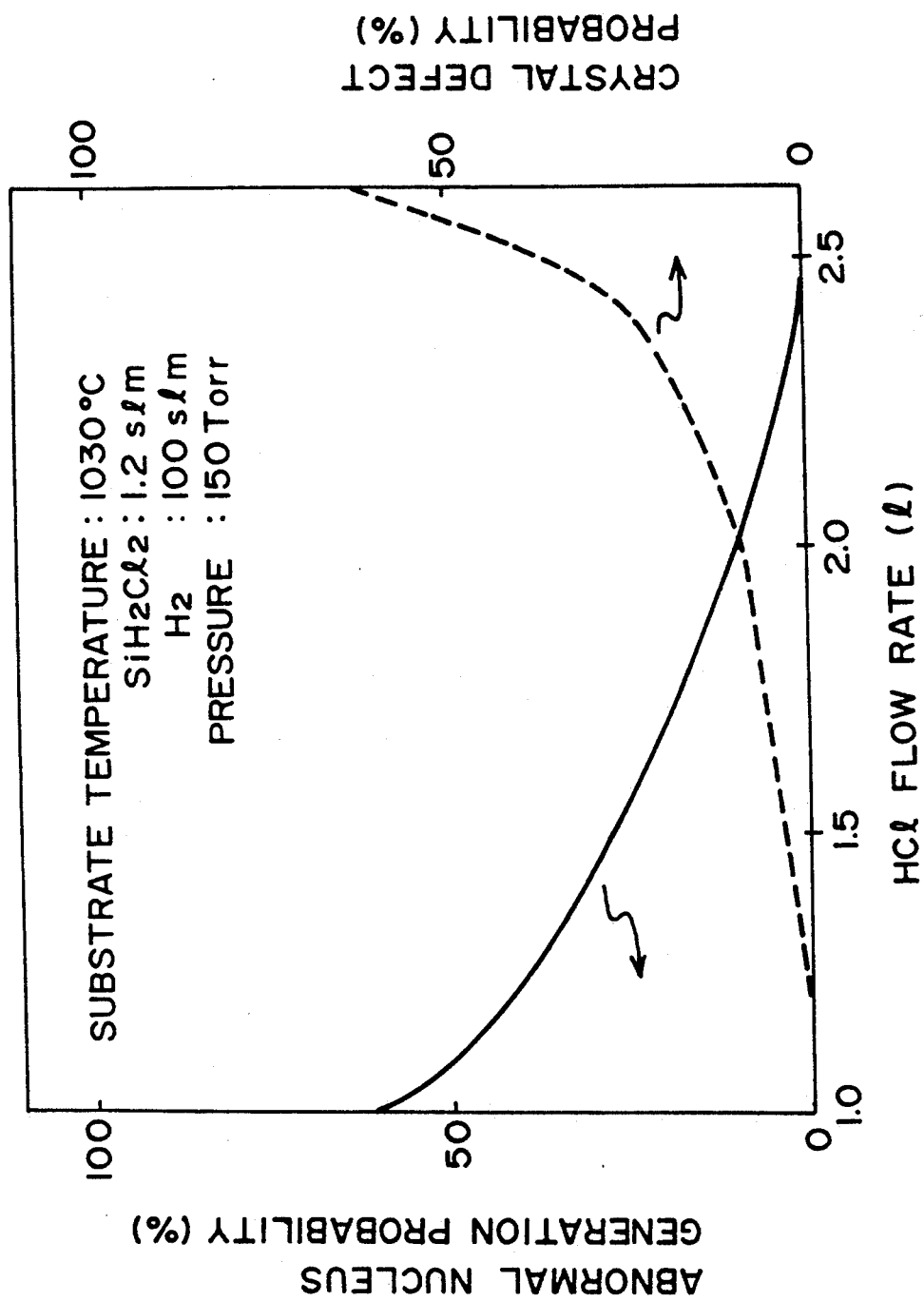
FIG. 2 is a graph showing the relationship between the HCl flow rate and abnormal nucleus generation probability, crystal defect generation probability in S1 monocrystal growth according to the selective nucleation method.

FIG. 2 shows the relationship between the flow rate of HCl, abnormal nucleus generation probability and crystal defect generation probability during crystal growth of Si crystal under the conditions of a substrate temperature of 1030° C., an amount of $SiH_2Cl_2$ introduced of 1.2 slm, an amount of $H_2$ introduced of 100 slm and a pressure of 1 Torr.

HCl here has the action of etching very fine initial nuclei of Si monocrystals by the reaction according to the reaction formula shown below.

$$Si + nHCl \rightarrow SiCl_n \uparrow + n/2H_2 \uparrow$$

For this reason, when the amount of HCl is increased, nucleation is inhibited to reduce abnormal nucleus generation probability, but there is at the same time the tendency that the crystal defect generation probability is increased. When the amount of HCl is reduced, nucleation can be effected with ease, and there is the tendency that abnormal nucleus generation probability is increased and crystal defect generation probability reduced.

Figure 3:
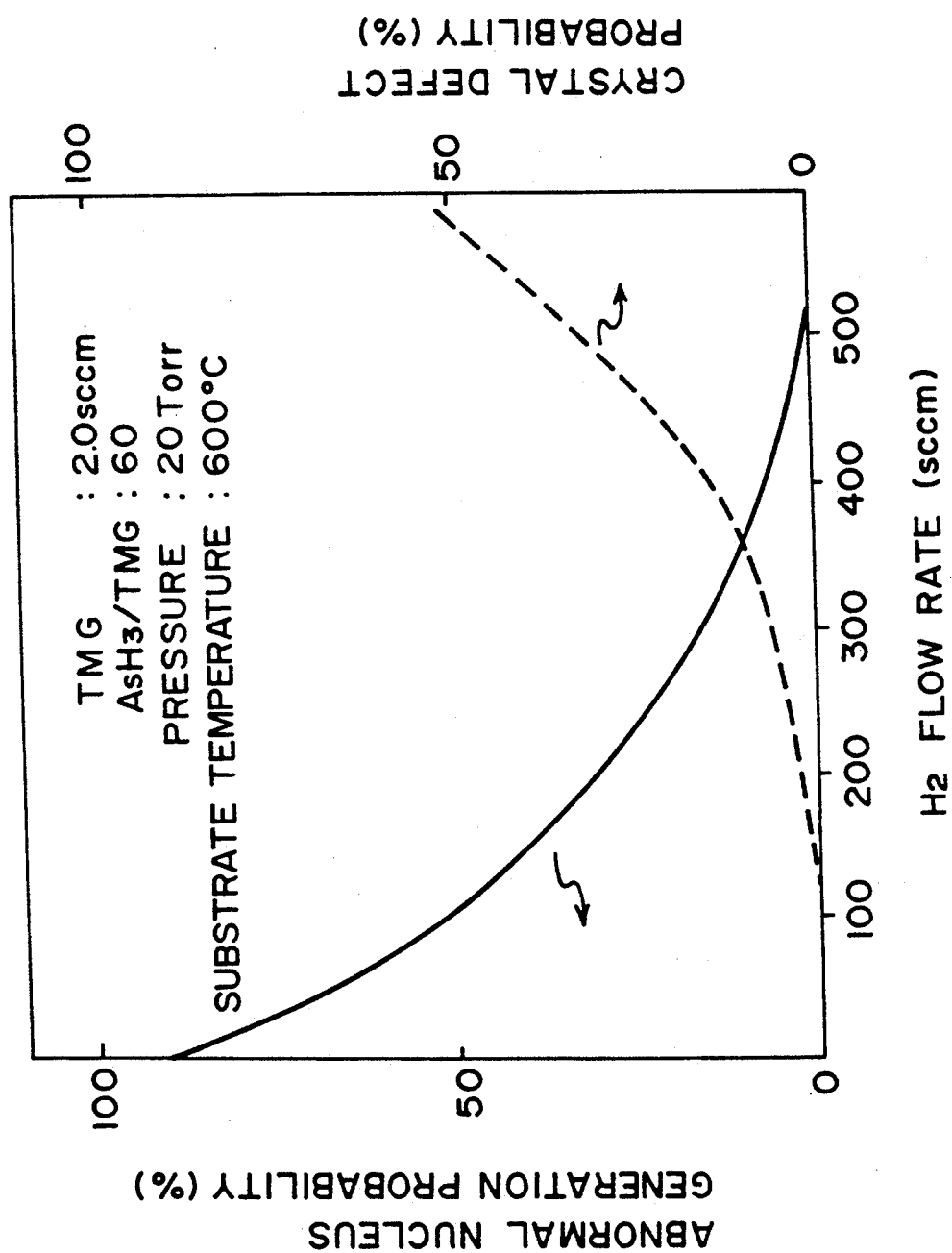
FIG. 3 is a graph showing the relationship between the $H_2$ flow rate and abnormal nucleus generation probability, crystal defect generation probability in GaAs monocrystal growth according to the selective nucleation method.

FIG. 3 shows an example of the result when crystal formation is effected according to the selective nucleation method by introducing simultaneously a plural number of reactive starting gases, showing the relationship between abnormal nucleus generation probability and crystal defect generation probability and $H_2$ flow rate when GaAs crystal was grown under the conditions of a pressure of 20 Torr, a substrate temperature of 600° C. and an introduction amount ratio of $AsH_3/TMG$ of 60.

As is apparent from FIG. 3, when $H_2$ flow rate is small, the crystal defect probability is reduced but the abnormal nucleus generation probability tends to be increased. On the contrary, when $H_2$ flow rate is large, the crystal defect probability is increased, and the abnormal nucleus generation probability tends to be reduced.

The present inventor has further studied in view of the various points as described above and consequently invented the crystal formation method of this application which inhibits generation of abnormal nucleus and also reduces crystal defect probability.

Figure 4:
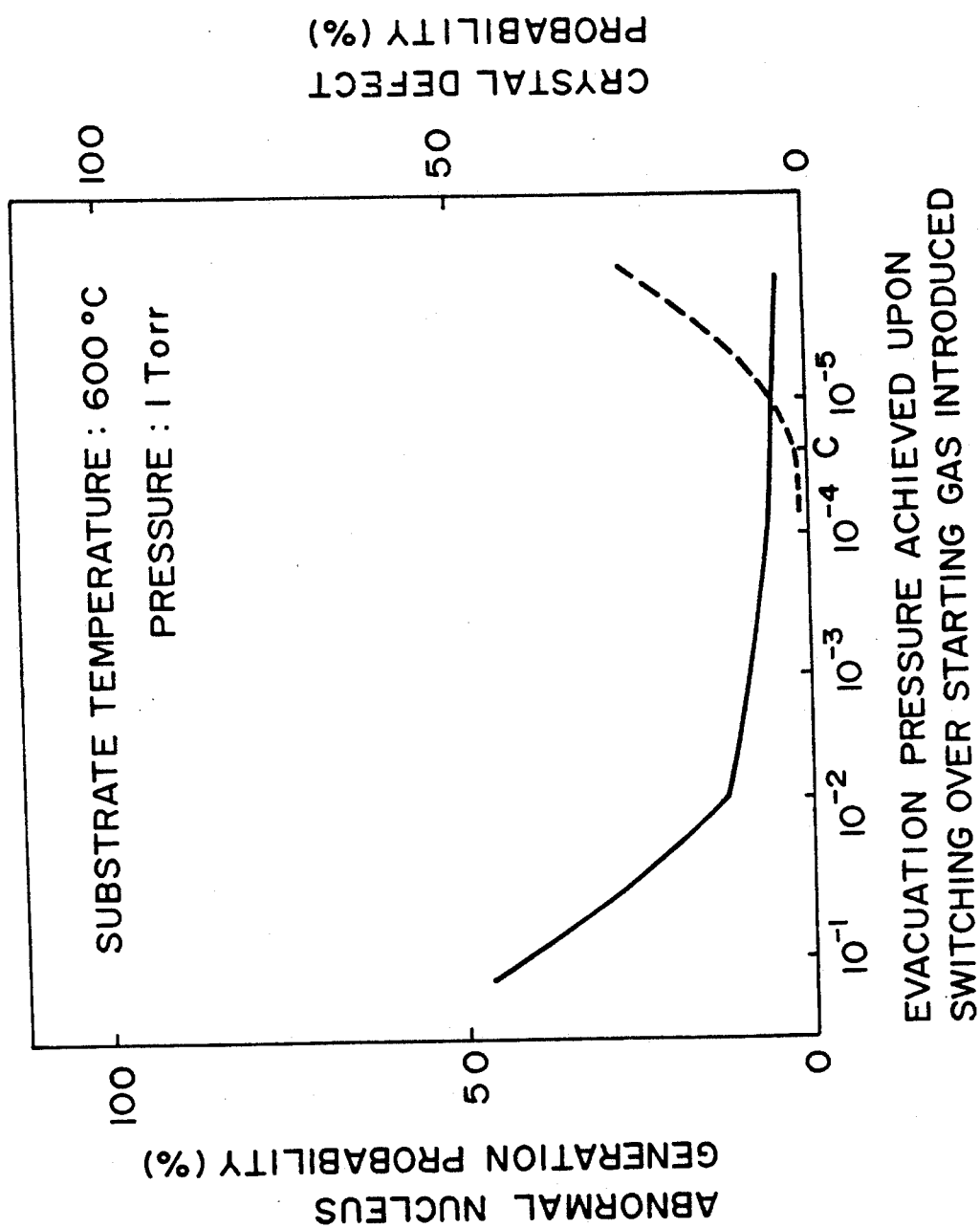
FIG. 4 is a graph showing the relationship between the reached pressure in the evacuated reaction chamber and abnormal nucleus generation probability and crystal defect generation probability when changing over the starting gas to another different kind of starting gas.
Figure 5A:
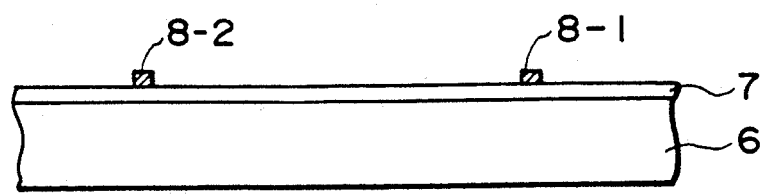
FIGS. 5a to 5d are other conceptional views of crystal growth according to the present invention.
Figure 5B:
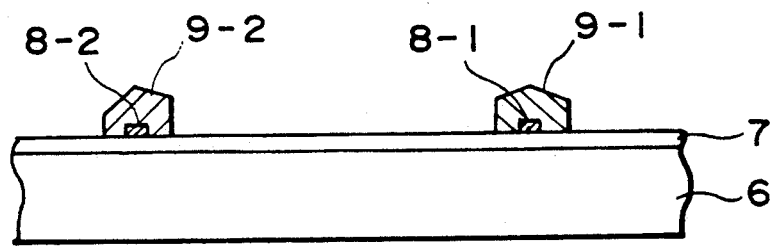
Figure 5C:
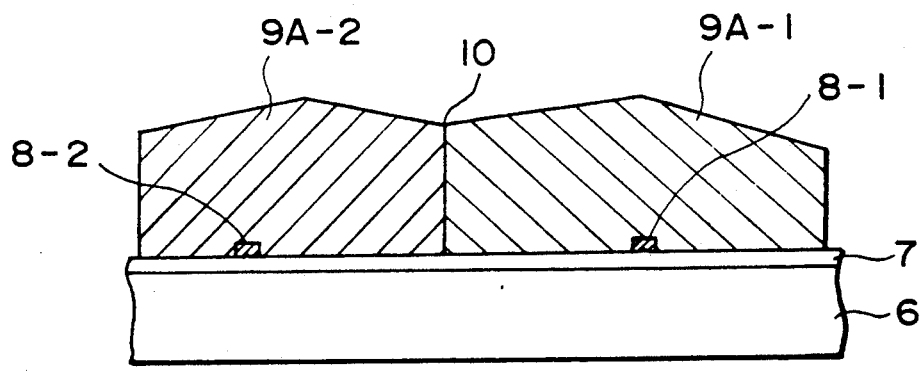
Figure 5D:
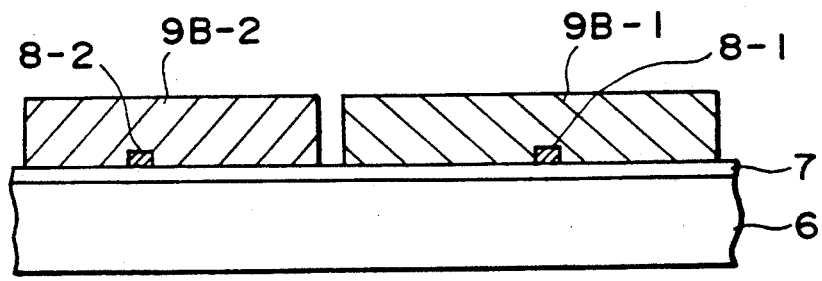

FIG. 4 shows the relationship of abnormal nucleus generation probability and crystal defect generation probability relative to the pressure within the reaction vessel reached when using a plural number of different starting gases and switching over one of the starting gases with the other starting gas in the crystal formation treatment by the gas phase method.

Abnormal nucleus generation probability has a critical point at $10^{-2}$ Torr, and at the reached pressure of that pressure or lower, the abnormal nucleus generation probability is suppressed at a low level, while at the reached pressure exceeding that pressure, the abnormal nucleus generation probability is increased.

On the other hand, the crystal defect generation probability has a critical point at $2.5 \times 10^{-5}$ Torr (see point C), and said crystal defect generation probability is suppressed at a low level at the reached pressure of that pressure or higher, while the crystal defect generation probability is increased at the reached pressure less than that pressure, and at the reached pressure lower than $1 \times 10^{-5}$ Torr, the above crystal defect generation probability will be increased in excess of the above abnormal nucleus generation probability.

As is also apparent from FIG. 4, abnormal nucleus generation probability could be suppressed at a low level and also the crystal defect generation probability could be suppressed at a low level according to the crystal growth method of the present invention.

Even when compared with the abnormal nucleus generation probability and the crystal defect probability at the optimum value ($H_2$ flow rate 360 sccm) when introducing different kinds of starting gases at the same time shown in FIG. 3, it can be understood that the present invention is improved in controllability of selective monocrystal growth.

EXAMPLE 1

By referring to FIG. 1, the method for forming a GaAs crystal on $SiO_2$ is to be described as an example of the present invention.

First, on a high melting glass support 1, a $SiO_2$ film 2 was deposited to 1000 Å according to the CVD method (chemical vapor deposition method) by use of silane ($SiH_4$) and oxygen ($O_2$) as the starting gases. The nucleation density ($ND_S$) of GaAs on $SiO_2$ is small, and the surface of the $SiO_2$ film gives the non-nucleation surface ($S_{NDS}$).

Next, the surface of the above $SiO_2$ film 2 was masked with a photoresist so that $50 \times 50$ of 1 μm square regions were formed.

By use of an ion implanter, As ions were implanted. As ions were implanted only onto the surface exposed (FIG. 1 (A)). The amount implanted at this time was $1 \times 10^{15}/cm^2$. On the $SiO_2$ surface where no As ion was implanted, the nucleation density ($ND_S$) remained small as it was, and this portion gave the non-nucleation surface ($S_{NDS}$). On the other hand, the regions 3-1, 3-2, wherein ions were implanted, have greater nucleation density ($ND_L$) than the non-nucleation surface ($S_{NDS}$), and these portions gave the nucleation surface ($S_{NDL}$).

After the photoresist was peeled off, the substrate was subjected to heat treatment in $H_2$ atmosphere at about 900° C. for about 10 minutes to clean the surface.

Subsequently, while the substrate was heated at 600° C., the reaction vessel was evacuated to $10^{-6}$ Torr, and 5 minutes later, trimethyl gallium (TMG) was introduced at a pressure of 1 Torr together with the carrier gas $H_2$, followed by evacuation one minute later to be reduced in pressure to $5 \times 10^{-5}$ Torr. After maintained at $5 \times 10^{-5}$ Torr for 5 seconds, arsine ($AsH_3$) was introduced to a pressure of 1 Torr together with the carrier gas $H_2$, and one minute later evacuated to be reduced in pressure to $5 \times 10^{-5}$ Torr. Then, TMG was flowed together with $H_2$, and the above-described operations were alternately repeated to grow the GaAs crystal.

As shown in FIG. 1 (B), GaAs crystals 4-1, 4-2 were formed only on the nucleation surface ($S_{NDL}$) 3-1, 3-2, and no GaAs crystal was formed on the non-nucleation surface ($S_{NDS}$), namely on the $SiO_2$ surface where no As ion was implanted.

When growth was further continued, GaAs crystals 4-1, 4-2 became contacted with each other as shown in FIG. 1 (C). At that state, growth was stopped and the surface was polished to effect etching of the grain boundary, whereby GaAs crystals 4-1, 4-2 were obtained as shown in FIG. 1 (D).

When $50 \times 50$ monocrystal islands were grown in this manner, there was no defect of crystal, and abnormal nucleation growth was observed for 10 crystals.

EXAMPLE 2

By referring to FIG. 5, the method for forming a ZnSe crystal is to be described as another example of the present invention.

First, on an alumina support 6, a $SiO_2$ film 7 was deposited to 1000 Å according to the CVD method by use of $SiH_4$ and $O_2$ as the starting gases.

Next, by use of $SiH_4$ and $NH_3$ as the starting gases, $SiN_x$ film was deposited to 300 Å according to the CVD method. The feeding ratio of $SiH_4$ and $NH_3$ was 2:1, the reaction pressure 0.15 Torr, and the high frequency power was $1.6 \times 10^{-2}$ W/cm². Further, the $SiN_x$ film was subjected to patterning to 1 μm square to form nucleation surface ($S_{NDL}$) 8-1, 8-2.

After the substrate thus formed was well washed, it was subjected to heat treatment in $H_2$ atmosphere at about 900° C. for 10 minutes to clean the surface.

Subsequently, while the substrate was heated at 450° C., the reaction vessel was internally evacuated to $10^{-6}$ Torr, and 5 minutes layer, diethylzinc (DEZn) was introduced with the carrier gas $H_2$ to 1 Torr, followed by evacuation one second later to $10^{-5}$ Torr. After maintained at $10^{-5}$ Torr for 5 seconds, diethylselenium (DESe) together with the carrier gas $H_2$ was introduced to 1 Torr, followed by evacuation one second later to $10^{-5}$ Torr. Then, $H_2$ and DEZn were again flowed, and the above-described operations were repeated to grow ZnSe crystals.

As shown in FIG. 5 (B), ZnSe monocrystals 9-1, 9-2 were grown originating from the nuclei formed on the nucleation surfaces ($S_{NDL}$) 8-1, 8-2 formed of $SiN_x$, and crystals were grown even to the non-nucleation surface ($S_{NDS}$), namely on the surface of $SiO_2$ film 7. When crystal formation treatment was further continued, ZnSe crystals 9A-1, 9A-2 were grown larger even until they came into contact with each other to form a polycrystal.

The surface of the polycrystal formed was polished to effect etching of the grain boundary 10, whereby ZnSe monocrystals 9B-1, 9B-2 as shown in FIG. 5 (D) were obtained. Also in this Example, similarly as in Example 1, abnormal nucleus generation probability and crystal defect probability were suppressed at low levels.

What is claimed is:

1. A gas phase method for forming II-VI group crystals or III-V group crystals in a crystal formation treatment space, comprising:

forming a substrate with a non-nucleation surface ($S_{NDS}$) and an adjacent nucleation surface ($S_{NDL}$), said nucleation surface ($S_{NDL}$) being comprised of an amorphous material having a sufficiently small area of 16 $\mu m^2$ or less so as to form only a single nucleus from which a single-crystal is grown, and having a larger nucleation density than said non-nucleation surface ($S_{NDS}$), wherein said nucleation surface ($S_{NDL}$) is formed by ion implantation and the amount of the ions implanted is at least $1 \times 10^{15}/cm^3$;

heating said substrate up to a substrate temperature within a range of 200° C. to 950° C.;

alternately feeding at least a first starting gas and a second starting gas into said crystal formation treatment space thereby forming said single nucleus and growing a single-crystal from said single nucleus, wherein the pressure during feeding of the starting gases is within a range of $10^{-1}$ Torr to 10 Torr, and wherein the time for feeding the starting gases is within a range of 5 sec. to 1 min.; and during said alternate feeding step, after the feeding of one of the starting gases is terminated and before commencing the feeding of the other starting gas, evacuating said crystal formation treatment space to a pressure within a range of $10^{-2}$ torr to $10^{-5}$ Torr, wherein the time for evacuating the starting gases is within a range of 20 sec. to 3 min.

2. A crystal formation method according to claim 1, wherein the nucleation surface is formed by ion implantation and the element for giving the ions to be implanted is an element selected from the group II elements, the group III elements, the group V elements or the group VI elements.

* * * * *

UNITED STATES PATENT AND TRADEMARK OFFICE
CERTIFICATE OF CORRECTION

PATENT NO. : 5,296,087

DATED : March 22, 1994

INVENTOR(S) : Hiroyuki Tokunaga

It is certified that error appears in the above-identified patent and that said Letters Patent is hereby corrected as shown below:

COLUMN 1

Line 18, "growth" should read --growth of--.
Line 35, "substrate" should read --substrates--.

COLUMN 3

Line 38, "S1" should read --Si--.

COLUMN 4

Line 1, "arise" should read --rise--.
Line 63, "of" should read --of the--.

COLUMN 5

Line 18, "as (A)" should read --gas (A)--.
Line 29, "$10^{-8}$" should read --$10^{-5}$--.
Line 56, "included" should read --be included--.

COLUMN 8

Line 44, "surface" should read --surfaces--.

UNITED STATES PATENT AND TRADEMARK OFFICE
CERTIFICATE OF CORRECTION

PATENT NO. : 5,296,087
DATED : March 22, 1994
INVENTOR(S) : Hiroyuki Tokunaga

It is certified that error appears in the above-identified patent and that said Letters Patent is hereby corrected as shown below:

COLUMN 10

Line 15, "$10^{-2}$ torr" should read --$10^{-2}$ Torr--.

Signed and Sealed this

Eighteenth Day of October, 1994

Attest:

BRUCE LEHMAN

Attesting Officer  Commissioner of Patents and Trademarks